US005854598A

United States Patent [19]

De Vries et al.

[11] Patent Number: 5,854,598

[45] Date of Patent: Dec. 29, 1998

[54] METHOD OF TESTING AN ANALOG-TO-DIGITAL CONVERTER

[75] Inventors: Ronald De Vries; Botjo Atzema, both of Eindhoven, Netherlands

[73] Assignee: U.S. Philips Corporation, New York, N.Y.

[21] Appl. No.: 726,284

[22] Filed: Oct. 4, 1996

[30] Foreign Application Priority Data

Jun. 17, 1996 [EP] European Pat. Off. .............. 96201683

[51] Int. Cl.[6] .......... H03M 1/12

[52] U.S. Cl. .......... 341/120; 341/155

[58] Field of Search .......... 341/120, 121, 341/155, 163, 118

[56] References Cited

U.S. PATENT DOCUMENTS 5,132,685 7/1992 De Witt et al. .......... 341/120

OTHER PUBLICATIONS

"Integrated Analog–to–Digital and Digital–to–Analog Converters", by Rudy van de Plassche, Kluwer Academic Publishers, ISBN 0–7923–9436–4, pp. 87–88.

*Primary Examiner*—Brian K. Young
*Attorney, Agent, or Firm*—Brian J. Wieghaus

[57] ABSTRACT

Only the value of the least-significant bit, or of some of the less-significant bits is used in order to test an analog-to-digital converter in an integrated circuit. The information concerning the differential and the integral non-linearity can be determined from the values of said less-significant bit. Furthermore, the functionality of the analog-to-digital converter is tested by counting the number of changes of the least-significant bit and by comparing this number with the value formed by the other bits.

27 Claims, 5 Drawing Sheets

METHOD OF TESTING AN ANALOG-TO-DIGITAL CONVERTER

BACKGROUND OF THE INVENTION

The invention relates to a method of testing an analog-to-digital converter in an integrated circuit, which method includes the following steps:

supplying an input of the analog-to-digital converter with a test signal which varies in time and covers a given voltage range in order to form a series of successive code words, each of which comprises a number of bits, on outputs of the analog-to-digital converter, determining the number of occurrences of code words having one or more given values in the series, characterizing the differential and/or the integral non-linearity of the analog-to-digital converter on the basis of the number of occurrences determined.

The invention also relates to an integrated circuit with an analog-to-digital converter which includes an input for receiving a test signal and outputs for supplying a number of bits which together constitute a code word converted from the test signal.

A method of this kind is known from the book "Integrated analog-to-digital and digital-to-analog converters" Rudy van de Plassche, Kluwer Academic Publishers, Boston/Dordrecht/London, ISBN 0-7923-9436-4. Pages 87–88 of the cited book describe a method of testing an integrated circuit which includes an analog-to-digital converter. According to this method a tester applies an analog test signal to the input of the analog-to-digital converter and from the outputs of the converter it receives the code word formed from the test signal by the converter in order to evaluate the quality of the converter. The code word converted by the analog-to-digital converter is converted into an analog result signal by a very accurate digital-to-analog converter. Comparison of the original analog test signal and the analog result signal provides a characterization of the so-called differential and integral non-linearity of the converter.

Integrated circuits executing a given digital operation on originally analog signals often include one or more analog-to-digital converters for converting the relevant analog signals into digital signals. In such an application of an analog-to-digital converter the digital code words are processed within the circuit without having to be output. However, if the known method is applied for testing an analog-to-digital converter in such a circuit, the digital code word must be fed out of the circuit for inspection. This has the drawback that the circuit then requires an additional number of external pins which are intended exclusively for such testing. One method of mitigating this drawback is to provide each of the external pins with a respective multiplexer via which, as desired, they feed a functional signal out and/or in in a functional mode or feed the code word out in a test mode. However, this has the drawback that additional control logic is required. Furthermore, integrated circuits which include several analog-to-digital converters often do not have enough external pins to output the code words of all analog-to-digital converters simultaneously in a test mode. The converters must then be tested consecutively. This implies a long test time and prolonged use of the expensive test equipment.

SUMMARY OF THE INVENTION

It is an object of the invention to improve the described method. To achieve this, the method according to the invention is characterized in that the number of occurrences is determined on the basis of a number of less-significant bits of the code words, the other bits being excluded and the number of less-significant bits being substantially smaller than the number of bits of a code word. The invention is based on the recognition of the fact that the characterization of the non-linearity of the analog-to-digital converter can be achieved by inspecting only one or a few of the less-significant bits of the code word instead of the entire code word. It is then no longer necessary to feed all bits of the code word out of the integrated circuit via external pins.

In one version of the method according to the invention the determination of the number of occurrences includes the following steps per code word:

reconstructing the relevant code word on the basis of the number of less-significant bits of the relevant code word and the value of the test signal corresponding to the relevant code word, and recording the occurrence of the relevant code word.

Using the knowledge as regards the changes to be expected for the test signal, for example being a sawtooth signal, a next code word can be reconstructed from a change of the value of the less-significant bits. Thus, for example a histogram of occurrences of the code words can be formed and compared with a histogram expected on the basis of the test signal. The histogram can thus be formed on the basis of only a few of the bits of the code words.

In a further version of the method according to the invention the number of occurrences is determined on the basis of the least-significant bit of the code word while excluding the other bits. When the frequency of the test signal is low in comparison with the sampling frequency of the analog-to-digital converter, each code word is sampled at least once upon presentation of such a test signal. The changes of values of exclusively the least-significant bit then suffice to enable reconstruction of the code words. In that case only one bit need be fed out from the integrated circuit for the test.

In a version of the method according to the invention the test signal comprises a voltage which varies linearly in time in order to form on the outputs a sub-series of code words of mutually equal value, the number of occurrences in the series being determined by determining the number of code words in the sub-series on the basis of the least-significant bit. The number of occurrences of the code words having the corresponding value can be determined by determination of the number of code words in the sub-series on the basis of changes of the value of the least-significant bit. The non-linearity of the converter can be characterized on the basis thereof.

In a version of the method according to the invention the analog-to-digital converter takes samples of the test signal under the control of a clock signal and converts the samples into a code word, the number of code words in the sub-series being determined by a counter which is reset by a change of value of the least-significant bit and counts the number of periods of the clock signal elapsing until a next change of value of the least-significant bit. The analog-to-digital converter forms one code word on the output from the analog signal presented per period of the clock signal. Using a counter for counting the number of periods of the clock signal, therefore, is a simple method of determining the number of code words in the sub-series.

In a further version of the method according to the invention the test signal is presented to the input in order to form a further sub-series of code words of mutually equal further value, the method including the following further steps:

determining the number of code words in the further sub-series, and further characterizing the integral non-linearity of the analog-to-digital converter on the basis of the number of code words thus determined.

The presentation of the test signal thus yields different sub-series of code words, each respective sub-series comprising code words having mutually equal respective values. The integral non-linearity can be further characterized by determination of the number of code words of said different sub-series.

In a version of the method according to the invention a further counter counts cycles comprising a change of value and a return to the original value of the least-significant bit due to the presentation of the test signal, the count thus formed being compared with a further code word formed by the other bits of the code word on the outputs of the analog-to-digital converter in order to detect correct operation of the analog-to-digital converter. Due to the counting of the number of changes of the value and the returns to the original value of the least-significant bit by the further counter, the contents thereof correspond to a further code word which is formed by the other bits, being all bits minus the least-significant bit, of the code word expected according to the test signal. By comparing, upon a change of contents, the contents of the further counter with the other bits of the further code word actually formed by the converter, it is checked whether the converter reproduces the code words correctly. This constitutes a further test of the desired functionality of the converter.

It is a further object of the invention to provide an integrated circuit of the kind set forth which can be more easily tested than the known integrated circuit. To achieve this, the integrated circuit in accordance with the invention is characterized in that a number of outputs which are arranged to output less-significant bits of the code word are coupled to a respective external pin of the integrated circuit while excluding the other outputs. The utilization of the pins of the circuit for the testing of the analog-to-digital converter is reduced by coupling only a limited number of the outputs of the converter to external pins. The converter can then be tested in the described manner. In a given embodiment of the integrated circuit according to the invention exclusively the output which is arranged to deliver the least-significant bit is coupled to an external pin. The use of the invention offers a substantial advantage notably in the case of an integrated circuit including a large number of analog-to-digital converters. Because of the limited number of additional pins required, the analog-to-digital converters can then be tested in parallel, that is to say simultaneously. The test time is thus substantially reduced, yielding a substantial saving in respect of the duration of use of the test equipment and hence also in respect of costs.

An embodiment of the integrated circuit in accordance with the invention includes a counter which is arranged to count cycles comprising a change of value and a return to the original value of the least-significant bit of the code word due to the presentation of the test signal, the integrated circuit also including a comparison circuit for comparing contents of the counter with a further code word formed on the other outputs of the analog-to-digital converter. When the integrated circuit is provided with a counter which counts the changes of value and the returns to the original value of the least-significant bit, it can be simply checked whether the converter is capable of generating the desired code words. The contents of such a counter constitute a code word which should correspond to the code word formed by the instantaneous bits on the other outputs of the converter. Correct or incorrect operation of the converter is then indicated by simple comparison of the contents and the code word.

In an embodiment of the integrated circuit according to the invention a low-pass filter for filtering the least-significant bit is connected in the coupling between the output of the analog-to-digital converter which is arranged to output the least-significant bit and the respective external pin. The use of a low-pass filter removes jitter, if any, from the least-significant bit. Such jitter may be caused by noise on the test signal and by quantization effects in the converter and could give rise to incorrect test measurements.

An embodiment of the integrated circuit according to the invention includes an analog-to-digital converter having an input for receiving a test signal and outputs for supplying a number of bits which together constitute a code word converted from the test signal, the analog-to-digital converter being arranged to take samples of the test signal under the control of a clock signal, characterized in that the integrated circuit includes a first counter for counting a number of periods of the clock signal between changes of value of the least-significant bit. The number of samples per code word, i.e. between successive changes of the least-significant bit due to the presentation of a test signal with a voltage varying linearly in time can thus be simply determined. This yields a characterization of the nonlinearity of the analog-to-digital converter.

An embodiment of the integrated circuit according to the invention includes a generator for generating the test signal. When the test signal is generated within the circuit, it is no longer necessary to supply an external test signal. Depending on the test, the test signal may have different appearances. Some examples are: a comparatively slowly increasing voltage, a sawtooth of low or high frequency, and a sine wave of low or high frequency. In this context high frequency is to be understood to mean a frequency in the range of half the sampling frequency of the converter, and a low frequency is to be understood to mean a frequency a few orders below the sampling frequency. A test with a low frequency signal offers an indication of, for example the differential and integral nonlinearity of the converter and whether the converter is capable of generating all code words. For a test using a low frequency signal it suffices to consider only the least significant bit. A test using a signal of high frequency, moreover, provides information concerning the dynamic behavior of the converter. However, some of the less significant bits must then be considered.

In the above embodiments of the integrated circuit according to the invention some alternative versions have been given with a so-called built-in self-test (BIST) of the analog-to-digital converter. A self-test of the circuit is then triggered by way of an instruction, possibly under some external control. Via a pin, the result of the self-test is output to the environment, for example in the form of a code. Such a test no longer requires expensive test equipment and it suffices to use a simple test environment. The use of BIST in an integrated circuit including an analog-to-digital converter is known per se from U.S. Pat. No. 5,132,685. During a test in the known circuit the preceding code word are stored in a respective N-bit register, N being the width of the converter and amounting to, for example 6 bits. An N-1 bit counter is updated in the circuit according to the invention. Consequently, in order to carry out a comparable test of the analog-to-digital converter the circuit according to the invention requires less than half the silicon surface area required by the known circuit. The known circuit also includes a comparison circuit for comparing the two N-bit code words, and control logic which decodes four states of the comparison circuit. The circuit according to the invention, however, includes a comparison circuit for comparing two N-1 bit code words, i.e. the contents of the counter and an instantaneously formed code word, and also simpler control logic which need only detect whether the two code words are equal or not. The comparison circuit according to the invention is simpler because it can perform a bit-by-bit comparison of the two code words. Thus, the comparison and detection of an error are also simpler in the circuit according to the invention and hence require less overhead in respect of silicon surface area than the known circuit.

These and other aspects of the invention will be apparent from and, elucidated with reference to the embodiments described hereinafter.

BRIEF DESCRIPTION OF THE DRAWINGS

In the drawings.

Corresponding reference numerals in the drawing denote corresponding or similar parts.

DESCRIPTION OF THE PREFERRED EMBODIMENTS

Figure 1:
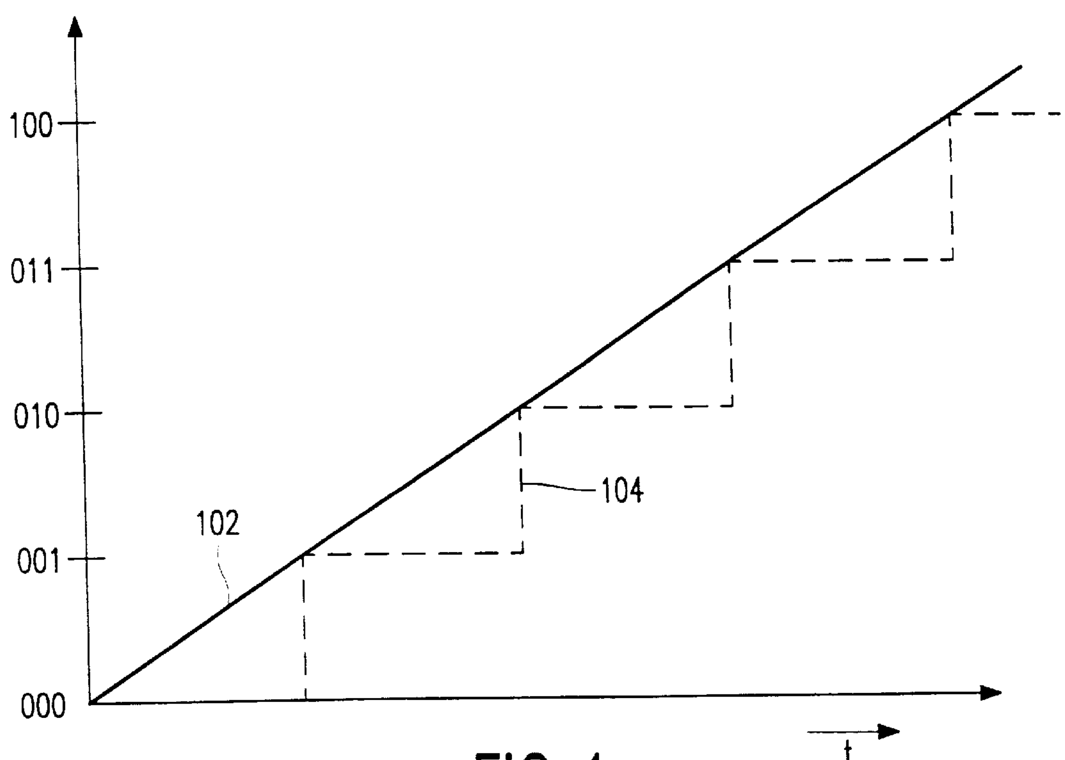
FIG. 1 shows an input signal for an analog-to-digital converter and the associated ideal response.

FIG. 1 shows an input signal for an analog-to-digital converter and the associated ideal response. The input signal is a voltage which increases linearly in time from a given minimum value to a given maximum value and is denoted by the line 102. On the outputs of the analog-to-digital converter there is formed a signal which increases linearly in time in discrete steps, thus following the input signal. The line 104 represents the ideal output signal associated with the input signal 102. Each step of the line 104 yields a digital code word which is formed on the outputs of the analog-to-digital converter.

Figure 2:
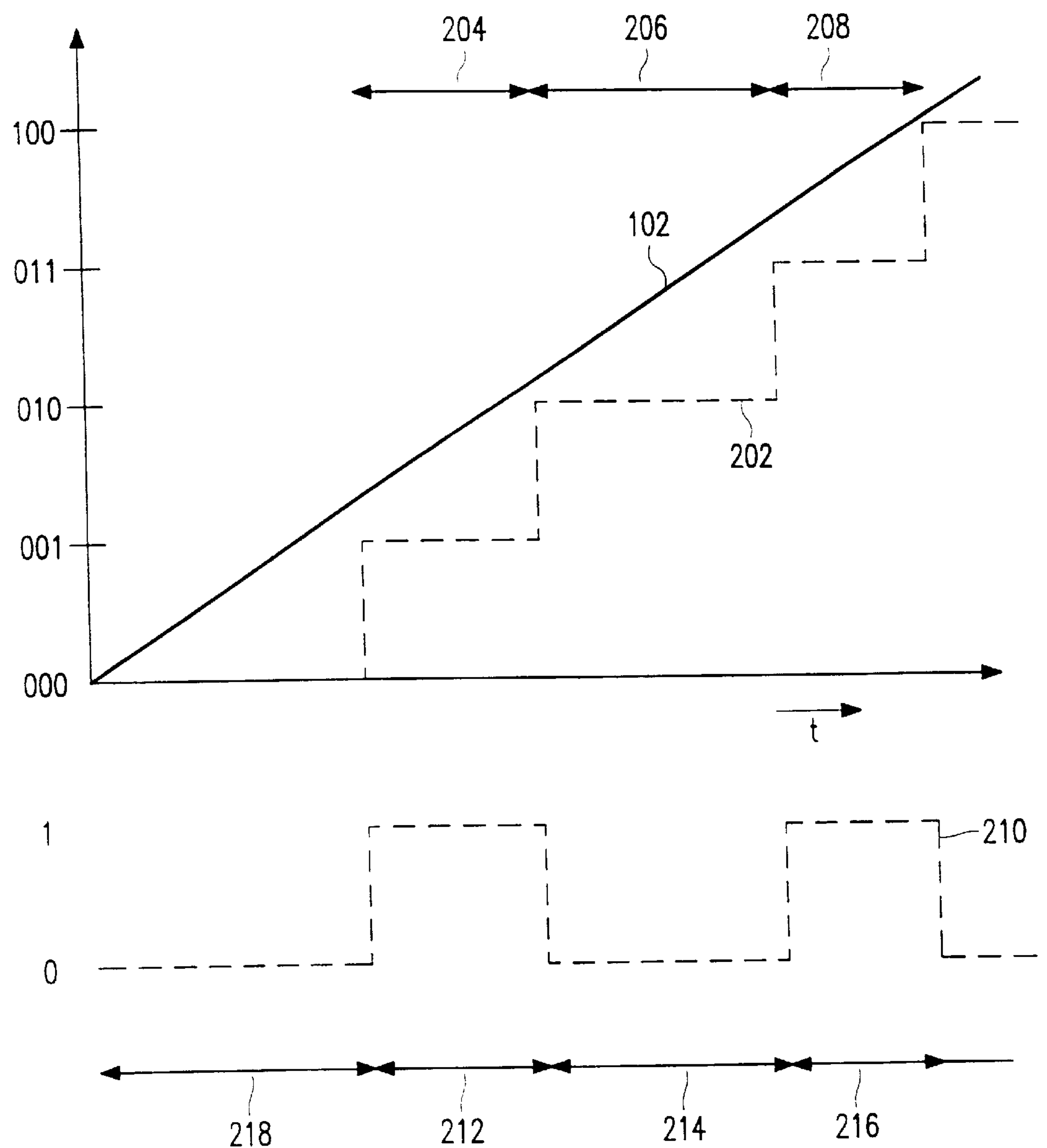
FIG. 2 shows an input signal for the analog-to-digital converter and the associated actual response, and also the variation of the least-significant bit.

FIG. 2 shows an input signal for the analog-to-digital converter and the associated actual response, and also the variation of the least-significant bit. The input signal is the same signal 102 and the output signal is also formed by a stepped line 202. Due to imperfections of the analog-to-digital converter, the output signal deviates from the ideal output signal 104 and measurement of the signal 202 by a tester offers a characterization of the quality of the analog-to-digital converter. The width of the steps, such as 204, 206 and 208, is a measure of the relevant differential non-linearity (DNL) of the analog-to-digital converter. The testing of finished analog-to-digital converters for DNL is subject to given standards concerning the maximum permissible deviation. An analog-to-digital converter which does not satisfy these standards is rejected. A further parameter determined from the test utilizing the signal 102 as the test signal and the signal 202 as the measured response is the so-called integral non-linearity (INL) of the digital-to-analog converter. This variable represents the difference between the expected transition point of the outputs and the actual transition point. The INL for a given point can also be determined by summing the individual values of the DNL per step upto the relevant point. The measurement is also suitable for determining the so-called offset of the analog-to-digital converter by measuring the width of the step 000, i.e. by determining the voltage when the converter outputs the first code word larger than 0.

As is described, for example, on the pages 87–88 of the cited book "Integrated analog-to-digital and digital-to-analog converters" Rudy van de Plassche, Kluwer Academic Publishers, Boston/Dordrecht/London, ISBN 0-7923-9436-4, the above tests are performed by applying each time the entire code word to the test equipment for inspection. Line 210 represents the value assumed by the least-significant bit of the code word in the course of time. When the code word assumes a next value, i.e. when it progresses to a next step according to the line 202, the value of the least-significant bit changes at that instant. The invention utilizes the fact that the transition points in the signal 202 can be traced exactly in the changes of the least-significant bit. The width 212 corresponds to 204 and therefrom the DNL can be determined for the code word 001; the width 214 corresponds to 206 and therefrom the DNL can be determined for 010, etc. The DNL can thus be determined by measurement of exclusively the value of the least-significant bit. For the same reason the INL of the analog-to-digital converter can also be determined by measurement of exclusively the least-significant bit. The same holds for the offset of the digital-to-analog converter which is derived from the least-significant bit according to the width 218. FIG. 2 shows a part of the input signal and the response of a 3-bit analog-to-digital converter. However, the number of bits is irrelevant and the idea of the invention can also be used in the case of analog-to-digital converters with code words comprising a different number of bits.

Figure 3:
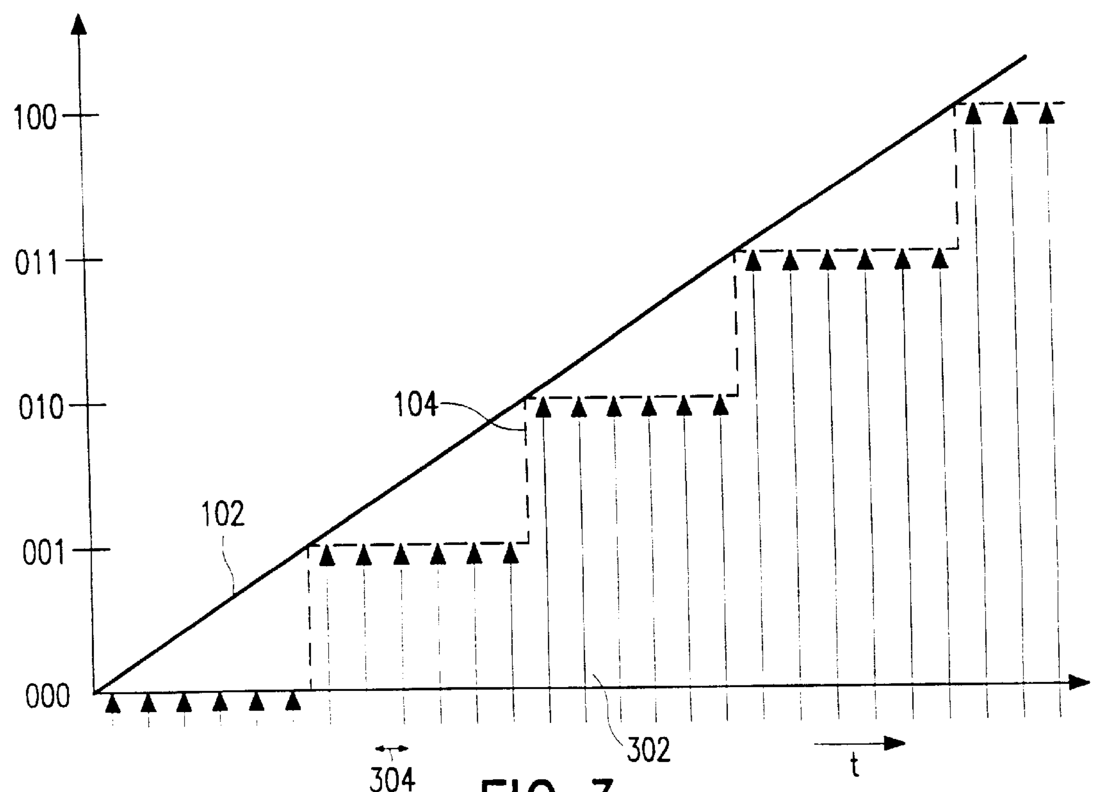
FIG. 3 shows the principle of sampling in an analog-to-digital converter.

FIG. 3 shows the principle of sampling in an analog-to-digital converter. An analog-to-digital converter takes a sample of the input signal at given instants and converts the sample into a code word on the outputs of the converter. A sample of this kind is represented by the line 302. The time $\Delta t$ elapsing between two successive samples. (an example of such a time interval is represented by the numeral 304) determines how often the analog-to-digital converter takes a sample of the input signal in conformity with the formule $f_{sample}=1/\Delta t$. In order to achieve accurate testing of the analog-to-digital converter in respect of the DNL and the INL, the number of samples per code word should be sufficiently large. A practical example involves the testing of a 6-bit analog-to-digital converter with a sampling frequency $f_{sample}$ of 10 MHz, the tester being arranged to take 64 samples per code word. A smaller number may be chosen without the reliability of the test being excessively degraded.

Figure 4:
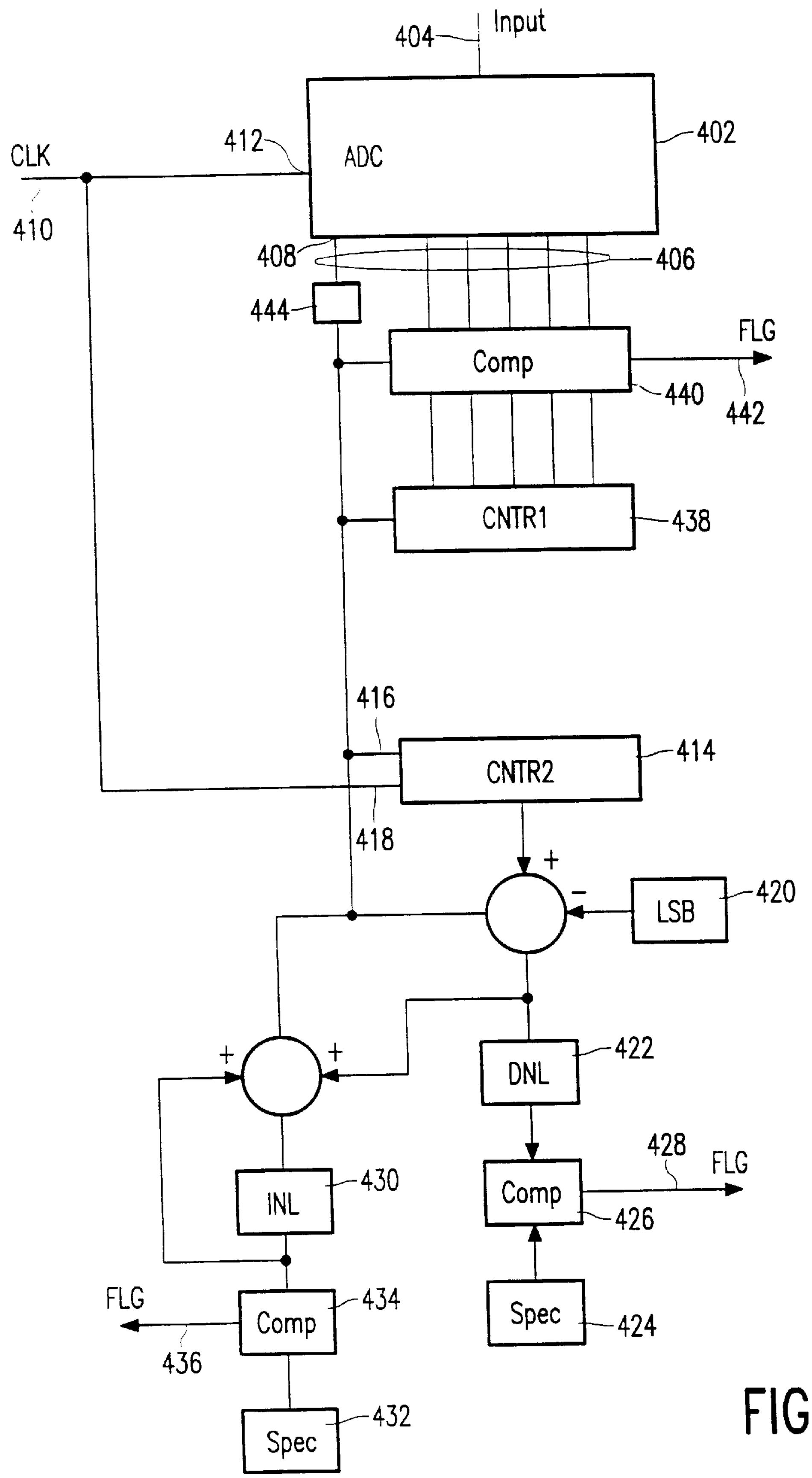
FIG. 4 shows a method of testing an analog-to-digital converter according to the invention.

FIG. 4 shows a method of testing an analog-to-digital converter according to the invention. An analog-to-digital converter 402 receives a test signal as shown in FIGS. 1 to 3 on an input 404 and forms a response on the outputs 406. A given one of the outputs delivers a given bit of a code word from the response. The output 408 carries the least-significant bit of the code word. The analog-to-digital converter 402 receives a clock signal 410 on a clock terminal 412. The clock signal determines when the analog-to-digital converter takes a sample of the input signal and converts it into a code word on the outputs. As has been described with reference to FIG. 2, the information for determining some important parameters of the analog-to-digital converter can be derived from the transitions of the least-significant bit. Therefore, the width of the various parts of the signal corresponding to the least-significant bit is determined, for example the parts 212–216 in FIG. 2. The width of such a part is determined by determining how many samples are taken for the given part. This is realized by counting the number of periods of the clock signal between the relevant two transitions of the least-significant bit in a counter 414. To achieve this, the counter 414 is reset by applying the signal of the least-significant bit to the reset input 416 of the counter, the clock signal 410 being applied to the count input 418. Each time when the value of the least-significant bit changes, the contents of the counter 414 are compared with the ideal value 420 and a difference 422 is determined. This difference is a measure of the differential non-linearity (DNL) of the analog-to-digital converter and is compared with the maximum deviation allowed by the specification 424. The comparison 426 yields a signal 428 which represents a pass/fail flag concerning the DNL of the analog-to-digital converter. In order to determine the integral non-linearity (INL) of the analog-to-digital converter, said differences 422 are summed for the code words which have meanwhile been passed. To this end, each time when the least-significant bit changes its value said difference 422 is added to a previously determined sum 430. The sum 430 is subsequently compared with a maximum deviation allowed by the specification 432. The comparison 434 yields a signal 436 representing a pass/fail flag concerning the INL of the analog-to-digital converter.

As a supplement to the described testing of the non-linearity there can be executed a so-called functionality test whereby it is checked whether the analog-to-digital converter is capable of generating all code words on the outputs 406 in conformity with the range of the converter. To this end, a further counter 438 counts how often the least-significant bit has completed a cycle of changing its value and returning to the original value. The contents of this counter 438 are compared with the code word formed on the outputs 406 minus the output 408 delivering the least-significant bit. This code word, being 1 bit shorter, should be equal to the contents of the counter 438. The comparison 440 yields a signal 442 indicating a pass/fail flag concerning the correct generation of the code words. The comparison 440 can be performed for each sample, but it suffices to perform it once after the least-significant bit has changed its value. To this end, the comparison 440 can be triggered by a change of value of the least-significant bit. It is thus established that the analog-to-digital converter can generate the new code word. A cycle of the least-significant bit comes down to the passing of a carry to the other bits, so that the number of cycles should always correspond to the value formed by said other bits.

Figure 7:
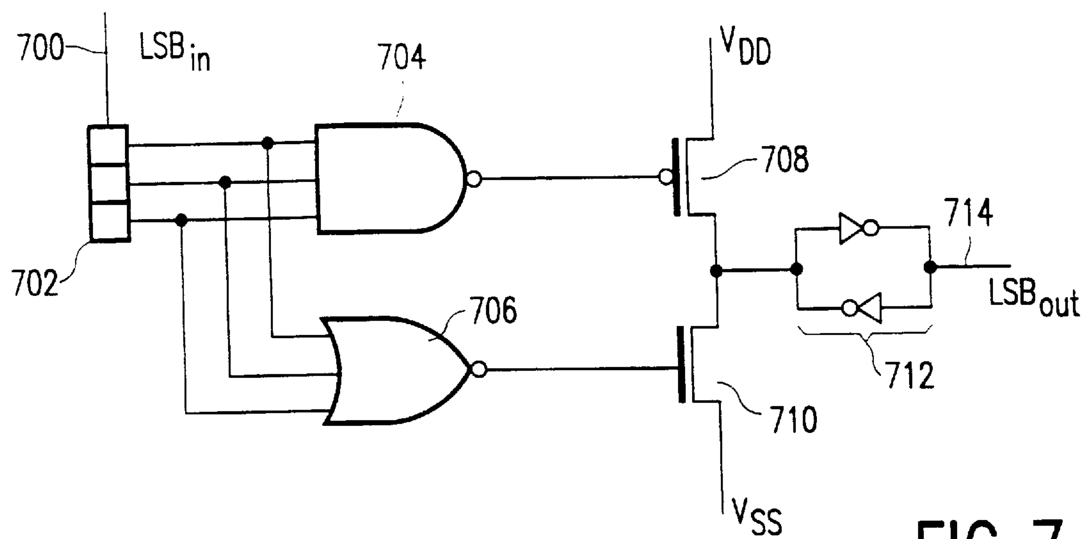
FIG. 7 shows an embodiment of a low-pass filter for the least-significant bit.

At a given instant the least-significant bit could unduly change its value for one sampling interval, for example due to noise, in the vicinity of the transition point, and subsequently assume the original value again. Such a situation may occur when the value of the input signal changes only slowly, for example in the case of a line 102 of FIG. 1 with a small slope so that the voltage remains in the vicinity of a transition point during a number of samples. Such a one-time incorrect value produces an error in the test and may lead to undue rejection of a correctly operating analog-to-digital converter. This problem of toggle of the least-significant bit can be solved by passing the signal of this bit through a low-pass filter 444 before further use. As a result, a change of value of the least-significant bit takes place only when a number of samples have this new value. Such a low-pass filter is shown in FIG. 7. Due to the presence of the low-pass filter, the values of the least-significant bit become available with a given delay. This is not objectionable for carrying out the described tests. When the low-pass filter is used, the comparison 440 should be performed with the same delay, i.e. the contents of the counter 438 should be the same again as the code word formed on the outputs 406 minus the output 408 delivering the least-significant bit. This can be achieved by making the change of value of the filtered least-significant bit trigger the comparison 440.

Figure 5:
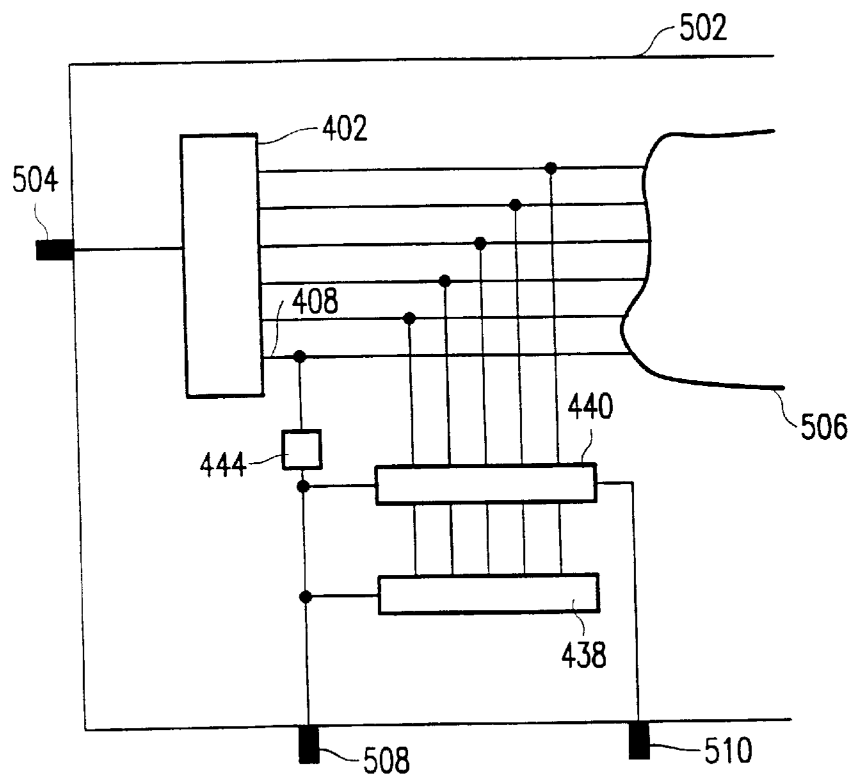
FIG. 5 shows some parts of an integrated circuit arranged for testing according to the invention.

FIG. 5 shows some parts of an integrated circuit which is arranged for testing according to the invention. The integrated circuit 502 includes an analog-to-digital converter 402 which converts an analog signal, received via an external pin 504, into a digital signal. The digital signal is processed by a processing circuit 506, the actual function of which is not elaborated herein because it is not relevant to the invention. The output 408 of the analog-to-digital converter carries every time the least-significant bit of the code words forming the digital signal. The output 408 is coupled to an external pin 508 for feeding out the least-significant bit from the integrated circuit in order to test the analog-to-digital converter 402 as described above. The output 408 may be coupled to an external pin 508 via the above low-pass filter 444, but is not necessarily coupled thereto. Furthermore, the integrated circuit may include a counter 438 and a comparison circuit 440 for executing the above functionality test. The result of this test is output via an external pin 510. The circuit may also include multiplexers for feeding out said test signals via the pins 508 and 510 in a test mode of the circuit, and for exchanging functional signals via these pins in the normal functional mode. The circuit may also include a multiplexer for the pin 504, for example for connecting a given circuit between the pin and the analog-to-digital converter or not. The integrated circuit 502 may include a number of analog-to-digital converters, each of which converts an analog signal into a digital signal for processing by the processing circuit 506. For each of the converters the output delivering the least-significant bit can then be coupled to an external pin.

Figure 6:
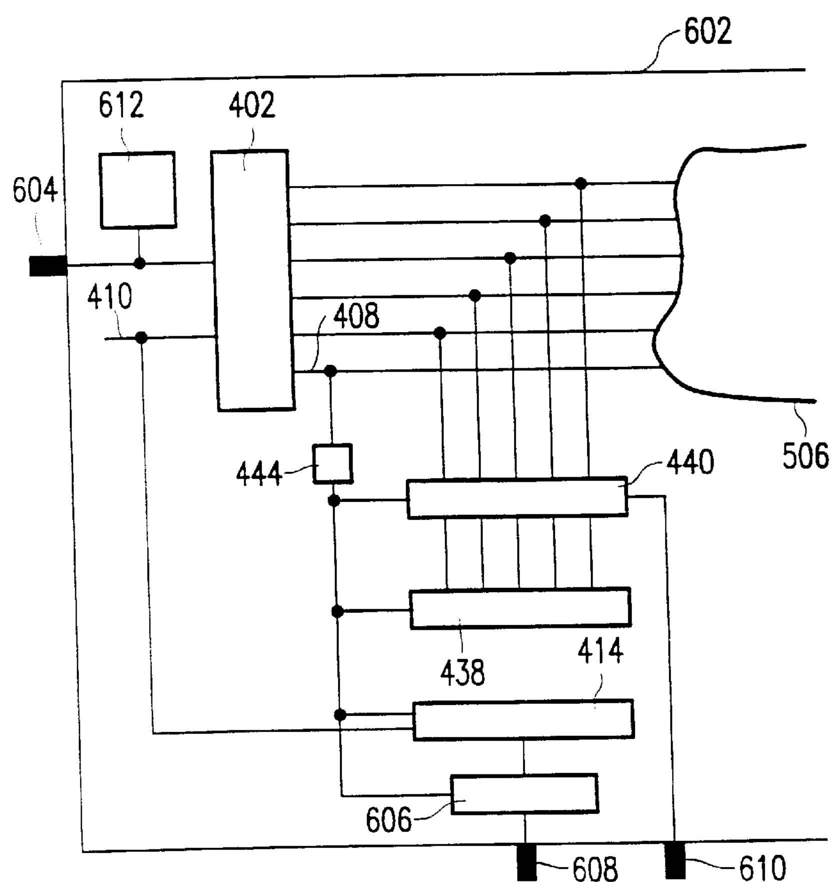
FIG. 6 shows an alternative embodiment of the integrated circuit according to the invention.

FIG. 6 shows an alternative embodiment of the integrated circuit according to the invention. The integrated circuit 602 includes an analog-to-digital converter 402 which converts an analog signal on the pin 604 into a digital signal for the processing circuit 506. In this embodiment, however, the least-significant bit is not fed out and the non-linearity test is executed within the circuit itself. To this end, the integrated circuit 602 includes a counter 414 and a circuit 606 for executing the test as described with reference to FIG. 4. The circuit 606 corresponds to the elements 420–436 shown in FIG. 4. The result of the non-linearity test is output via a pin 608. The clock signal 410 counted in the counter 414 may be an external clock signal or be generated within the circuit itself. This is not relevant to the invention. The integrated circuit 602 may also include a counter 438 and a comparison circuit 440 for executing the described functionality test. The result thereof is then output from the circuit via a pin 610. The pins 608 and 610 can also be made suitable for multiple use via a multiplexer. The integrated circuit in a further embodiment may include a generator 612 for generating the test signal presented to the analog-to-digital converter in order to execute the tests.

FIG. 7 shows an embodiment of a low-pass filter for the least-significant bit. The input 700 of the filter is coupled to a shift register 702 which can store three successive values of the least-significant bit. The three cells of the shift register are coupled to three respective inputs of a NAND-gate 704 and to three respective inputs of a NOR-gate 706. The filter also includes transistors 708 and 710 and a fed-back buffer 712 which is coupled to the output 714 of the filter. When all bits in the shift register have the same value, i.e. when three successive values of the least-significant bit are the same, this value is applied to the output 714. The filter retains the original value on the output as long as at least one of the bits in the shift register has a deviating value. This is achieved by proportioning the transistors and the buffer in such a manner that when the inputs of the transistors each receive a different value (which is the case when the bits in the shift register are not all the same) the buffer 712 sustains the original value. The length of the shift register and the associated number of inputs of the NAND-gate and the NOR-gate determine how often the least-significant bit can toggle before it is assumed that the new value concerns a stable situation. The length of three shown in FIG. 7 is merely an example and other values are also feasible.

Figure 8:
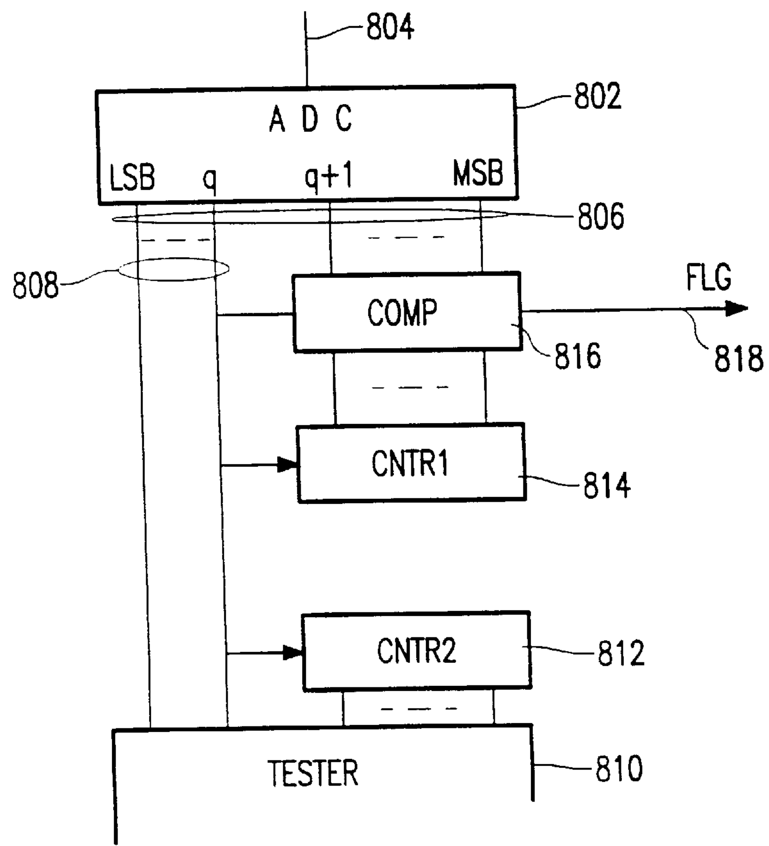
FIG. 8 shows an alternative method of testing an analog-to-digital converter according to the invention.

FIG. 8 shows an alternative method of testing an analog-to-digital converter in accordance with the invention. In order to be tested an analog-to-digital converter 802 receives an analog test signal having a frequency $f_{test}$ on an input 804 and converts it, with a sampling frequency $f_{sample}$, into n-bit code words on n outputs 806. Per code word a number of q less-significant bits, delivered on q outputs 808, is applied to a tester 810 in order to determine the non-linearity of the analog-to-digital converter as described with reference to FIG. 4. The counter 414 described with reference thereto is in this case a (n-q)-bit counter 812 which counts the number of periods of the clock signal between transitions of the bit q. It is to be noted that the counter 812 may also be included in the tester 810. When q bits are applied to the tester instead of only one bit as described before, tests can also be performed by means of a test signal of higher frequency. In the case of the higher frequency of the test signal the tester can still reconstruct the code word generated on the outputs 806 on the basis of only q bits. This offers the advantage that still only q bits need be fed out from the integrated circuit instead of the complete n-bit code word. The number of q bits required is given by the formule:

$$q=\text{ceil}\ ({}^2\log\ (2^n \cdot f_{test}/f_{sample}+NL_{margin}))$$

Therein, ceil is the mathematical function for rounding up and $NL_{margin}$ is the permitted nonlinearity deviation of the analog-to-digital converter. This margin is given by the formule:

$$NL_{margin}=\min\ (DNL\cdot 2^q, INL\cdot 2)$$

Therein, min is the mathematical function for obtaining the smallest of the arguments. DNL and INL are expressed as the width of the steps of the ideal response 104 of FIG. 1 and amount to, for example 0.5.

In this version a functionality test can also be executed by counting the number of cycles of changes of the value of the bit q in a counter 814 and comparing this number with the code word formed by the other n-q bits on the outputs 806 of the analog-to-digital converter. The comparison 816 then yields a signal 818 which is a pass/fair flag in respect of correct generation of the code words.

An analog-to-digital converter can also be tested by means of a test signal other than the described linearly increasing voltage. For example, sinusoidal signals or saw-tooth signals can be used; such signals are possibly repeatedly presented with each time a different frequency in order to determine the dynamic behavior of the analog-to-digital converter. The tester then records the distribution of the code words through the entire value range and forms a histogram therefrom. Comparison of this histogram with a histogram expected on the basis of the relevant test signal then provides the information for the various parameters to be determined for the analog-to-digital converter. Tests utilizing such signals can also make use of the fact that changes of the code word correspond to changes of some of the less-significant bits or of the least-significant bit. The tester can reconstruct the entire code word on the basis of the less-significant bits and the behavior of the test signal.

We claim:

1. A method of testing an analog-to-digital converter in an integrated circuit, which method comprises the following steps:

supplying an input of the analog-to-digital converter with a test signal which varies in time and covers a given voltage range in order to form a series of successive code words, each of which comprises a plurality of bits, on outputs of the analog-to-digital converter, excluding at least the most significant bit from the outputs of the analog-to-digital converter to form a set of bits excluding at least the most significant bit, determining the number of occurrences of code words having one or more given values in the series by examining the set of bits, and characterizing the differential and/or the integral non-linearity of the analog-to-digital converter on the basis of the number of occurrences determined.

2. A method as claimed in claim 1, in which the determination of the number of occurrences includes the following steps per code word:

reconstructing the relevant code word on the basis of the number of less-significant bits of the relevant code word and the value of the test signal corresponding to the relevant code word, and recording the occurrence of the relevant code word.

3. A method as claimed in claim 2, in which the determination of the number of occurrences is performed on the basis of the least-significant bit of the code word while excluding all of the other bits.

4. A method as claimed in claim 1, in which the test signal comprises a voltage which varies linearly in time in order to form on the outputs a sub-series of code words of mutually equal value, the number of occurrences in the series being determined by determining the number of code words in the sub-series on the basis of the least-significant bit.

5. A method as claimed in claim 4, in which the analog-to-digital converter takes samples of the test signal under the control of a clock signal and converts the samples into a code word, the number of code words in the sub-series being determined by a counter which is reset by a change of value of the least-significant bit and counts the number of periods of the clock signal elapsing until a next change of value of the least-significant bit.

6. A method as claimed in claim 5, in which characterization is performed by comparing the number of periods of the clock signal counted with a predetermined value.

7. A method as claimed in claim 6, in which the test signal is presented to the input in order to form a further sub-series of code words of mutually equal further value, the method including the following further steps:

determining the number of code words in the further sub-series, and further characterizing the integral non-linearity of the analog-to-digital converter on the basis of the number of code words thus determined.

8. A method as claimed in claim 7, further comprising the step of counting cycles comprising a change of value and a return to the original value of the least-significant bit due to the presentation of the test signal, the count thus formed being compared with a further code word formed by the other bits of the code word on the outputs of the analog-to-digital converter in order to detect correct operation of the analog-to-digital converter.

9. A method as claimed in claim 8, further comprising low pass filtering the least-significant bit and using the result thereof for determining the number of occurrences.

10. An integrated circuit with an analog-to-digital converter which includes an input for receiving a test signal and outputs for supplying a first number of bits which together constitute a code word converted from the test signal, characterized in that a second number of the outputs, said second number being less than said first number, otuput less-significant bits of the code word and are coupled to a respective external pin of the intergrated circuit while excluding the other outputs.

11. An integrated circuit as claimed in claim 10, in which the output which the least-significant bit is coupled to an external pin while excluding the other outputs.

12. An integrated circuit as claimed in claim 11, which includes a counter which is arranged to count cycles comprising a change of value and a return to the original value of the least-significant bit of the code word due to the presentation of the test signal, the integrated circuit also including a comparison circuit for comparing contents of the counter with a further code word formed on the other outputs of the analog-to-digital converter.

13. An integrated circuit as claimed in claim 12, further comprising a low-pass filter for filtering the least-significant bit, the low pass filter being connected in the coupling between the output of the analog-to-digital converter which is arranged to output the least-significant bit and the respective external pin.

14. An integrated circuit, including an analog-to-digital converter having an input for receiving a test signal and outputs for supplying a number of bits which together constitute a code word converted from the test signal, the analog-to-digital converter being arranged to take samples of the test signal under the control of a clock signal, characterized in that the integrated circuit includes a first counter for counting a number of periods of the clock signal between changes of value of the least-significant bit.

15. An integrated circuit as claimed in claim 14, which includes a first comparison circuit for comparing the number of periods counted with a predetermined value in order to characterize the non-linearity of the analog-to-digital converter.

16. An integrated circuit as claimed in claim 15, which includes a second counter which is arranged to count cycles comprising a change of value and a return to the original value of the least-significant bit of the code word due to the presentation of the test signal, and a second comparison circuit for comparing contents of the counter with a further code word formed on the other outputs of the analog-to-digital converter.

17. An integrated circuit as claimed in claim 16, which includes a low-pass filter which is connected in the coupling between the output of the analog-to-digital converter supplying the least-significant bit and the first counter.

18. An integrated circuit as claimed in claim 17, which includes a generator for generating the test signal.

19. A method as claimed in claim 1, in which the determination of the number of occurrences is performed on the basis of the least-significant bit of the code word while excluding all of the other bits.

20. A method as claimed in claim 4, in which the test signal is presented to the input in order to form a further sub-series of code words of mutually equal further value, the method including the following further steps:

determining the number of code words in the further sub-series, and further characterizing the integral non-linearity of the analog-to-digital converter on the basis of the number of code words thus determined.

21. A method as claimed in claim 3, further including the step of counting cycles comprising a change of value and a return to the original value of the least-significant bit due to the presentation of the test signal, the count thus formed being compared with a further code word formed by the other bits of the code word on the outputs of the analog-to-digital converter in order to detect correct operation of the analog-to-digital converter.

22. A method as claimed in claim 4, further comprising low pass filtering the least-significant bit and using the result thereof for determining the number of occurrences.

23. An integrated circuit as claimed in claim 10, further including a low-pass filter for filtering the least-significant bit which is connected in the coupling between the output of the analog-to-digital converter which is arranged to output the least-significant bit and the respective external pin.

24. An integrated circuit as claimed in claim 14, which includes a second counter which is arranged to count cycles comprising a change of value and a return to the original value of the least-significant bit of the code word due to the presentation of the test signal, and a second comparison circuit for comparing contents of the counter with a further code word formed on the other outputs of the analog-to-digital converter.

25. An integrated circuit as claimed in claim 14, further including a low-pass filter connected in the coupling between the output of the analog-to-digital converter supplying the least-significant bit and the first counter.

26. An integrated circuit as claimed in claim 14, which includes a generator for generating the test signal.

27. A method according to claim 1, wherein said set of bits is substantially smaller than the plurality of bits of the code word.

* * * * *